US006784710B2

(12) United States Patent
Andersen et al.

(10) Patent No.: US 6,784,710 B2
(45) Date of Patent: Aug. 31, 2004

(54) MULTISTAGE PULSE WIDTH MODULATOR

(75) Inventors: Jack B. Andersen, Austin, TX (US); Caleb Roberts, Longmont, CO (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/316,376

(22) Filed: Dec. 11, 2002

(65) Prior Publication Data

US 2004/0113671 A1 Jun. 17, 2004

(51) Int. Cl.$^7$ .................................................. H03K 3/17
(52) U.S. Cl. ....................................... 327/172; 327/170
(58) Field of Search ................................ 327/208, 374, 327/560, 561, 562, 563, 170, 171, 172, 173, 174, 175; 330/261, 252, 253, 277, 288, 295, 296; 326/63, 68

(56) References Cited

U.S. PATENT DOCUMENTS

| | | | | |
|---|---|---|---|---|
| 6,275,403 B1 * | 8/2001 | McNulty et al. | ............ | 363/131 |
| 6,563,377 B2 * | 5/2003 | Butler | ......................... | 330/10 |
| 6,580,236 B2 * | 6/2003 | Mitsuda | ...................... | 318/254 |
| 6,611,439 B1 * | 8/2003 | Yang et al. | .................. | 363/41 |

* cited by examiner

*Primary Examiner*—Timothy P. Callahan
*Assistant Examiner*—Cassandra Cox
(74) *Attorney, Agent, or Firm*—Steven Lin, Esq.

(57) ABSTRACT

Two or more pulse width modulation stages, each having progressively higher resolution, are utilized to allow the lower resolution stage or stages to operate at lower clock speeds. Later stages are operated at higher clock speeds and thus a smaller portion of the total pulse width modulation circuit utilizes the higher clock speed. Additionally, later stages operate over smaller time intervals in order to reduce usage of the later stages.

19 Claims, 3 Drawing Sheets

MULTISTAGE PULSE WIDTH MODULATOR

FIELD OF THE INVENTION

The present invention relates to the field of pulse width modulation and, more particularly, to multistage pulse width modulators.

BACKGROUND OF THE INVENTION

Pulse width modulation circuits ("pulse width modulators") are utilized in a variety of different applications including digital-to-analog conversion, power supply control, and motor control. For example, pulse width modulators are utilized in digital pulse width modulator power amplifiers for audio amplification. Such devices eliminate the need for an extra digital-to-analog converter and enhance efficiency of the audio amplifier.

In general, the resolution R of a pulse width modulator output signal is determined by the ratio of the pulse width modulator counter clock rate F_CLK to the pulse width modulator output pulse frequency F_PWM. For example, for a two-level modulation scheme, R=(F_CLK/F_PWM)+1. Thus, in order to enhance the resolution of a pulse width modulator output signal for a given output pulse frequency, the pulse width modulator counter clock rate F_CLK needs to be increased.

Increasing the clock rate for the entire pulse width modulator circuit has certain drawbacks. As the clock rate for a circuit increases, the current consumption of the circuit also increases. Increased current consumption is particularly undesirable in applications in which power consumption is a critical operating characteristic. Increased current consumption leads to undesirable circuit heating. Higher circuit clock rates also increase the chance that noise signals will couple to other parts of the circuit, particularly in devices in which the pulse width modulator is part of an integrated circuit. Additionally, increasing the clock rate of a pulse width modulator increases the complexity of the circuit.

Accordingly, the desire and need to have a pulse width modulator design that allows for high resolution operation exist while avoiding some or all of the problems associated with increasing the clock rate of a pulse width modulation circuit.

SUMMARY OF THE INVENTION

Two or more pulse width modulation stages, each having progressively higher resolution, are utilized to allow the lower resolution stage or stages to operate at lower clock speeds. Later stages are operated at higher clock speeds, and thus a smaller portion of the total pulse-width modulation circuit utilizes the higher clock speed. Additionally, later stages operate over smaller time intervals in order to reduce usage of the later stages.

Accordingly, one aspect of the present invention provides an apparatus including a first pulse width modulator stage and a second pulse width modulator stage. The first pulse width modulator stage includes a first comparator operable to receive a first reference signal and a sample signal and to compare the first reference signal to the sample signal. The second pulse width modulator stage is coupled to the first pulse width modulator stage and includes a second comparator operable to receive a second reference signal and the sample signal and to compare the second reference signal to the sample signal.

Another aspect of the present invention provides a method of producing a pulse width modulated signal. A first reference signal is generated. The first reference signal is compared to a sample signal. A first output signal is produced depending on the comparison of the first reference signal to a sample signal. A second reference signal is generated. The second reference signal is compared to the sample signal. A second output signal is produced depending on the comparison of the second reference signal to the sample signal.

The foregoing is a summary and thus contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

A more complete understanding of the present invention and advantages thereof may be acquired by referring to the following description and the accompanying drawings, in which like reference numbers indicate like features.

DETAILED DESCRIPTION

The following sets forth a detailed description of at least the best contemplated mode for carrying out the one or more devices and/or processes described herein. The description is intended to be illustrative and should not be taken to be limiting.

Figure 1:
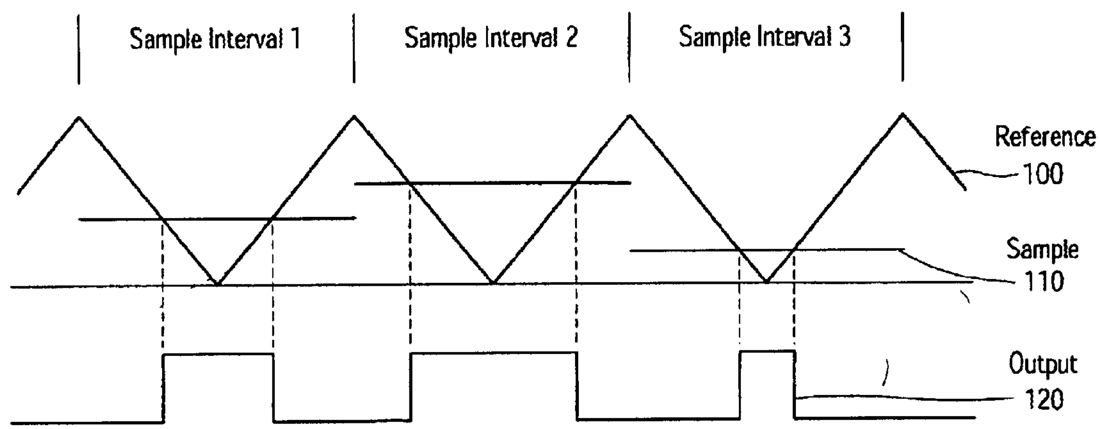
FIG. 1 illustrates exemplary waveforms and signals associated with the pulse width modulation process.

FIG. 1 illustrates exemplary waveforms and signals associated with the pulse width modulation process. General operation of a pulse width modulator involves comparing a sample signal (e.g., sample 110) to a reference signal (e.g., reference 100) and producing an output signal 120 depending on the result of the comparison. In a typical example, reference signal 100 is a triangle waveform as shown in FIG. 1. Pulse width modulators that use triangle waveforms centered on the sample interval as the reference signal are often referred to as double-sided modulators. The timing of reference signal 100 is selected to correspond with the desired sample intervals. For example, one period of reference signal 100 corresponds to the time period for each sample interval, and reference signal 100 is selected so that peaks of the signal correspond to sample interval boundaries. For each sample interval, sample 110 is determined by some appropriate means. For example, each sample value is based on a digital value supplied to the pulse width modulator.

In the example of FIG. 1, output signal 120 is low when reference signal 100 is greater than or equal to sample signal 110. When sample signal 110 is greater than reference signal 100, output signal 120 is high. Thus, larger sample values result in wider pulses, and smaller sample values result in narrower pulses. Sample values less than the minimum reference signal result in an output pulse that is entirely low, and sample values higher than the maximum reference signal result in an output pulse that is entirely high.

A number of variations of this basic scheme may be utilized with the present invention. For example, the comparison utilized to determine output signal 120 is changed so that output signal 120 is high when reference signal 100 is greater than or equal to sample signal 110 and output signal 120 is low when sample signal 110 is greater than reference signal 100. Alternately, simple circuit elements such as inverters are utilized to transform output signal 120 into the desired format. Different reference signals, such as sawtooth waveforms, may be utilized. Additionally, the timing relationship among the reference signal, the sample signal, and the sample interval are adjusted as necessary to produce the desired result. FIG. 1 is generally representative of the waveforms associated with either analog or digital implementations of pulse width modulators.

Figure 4A:
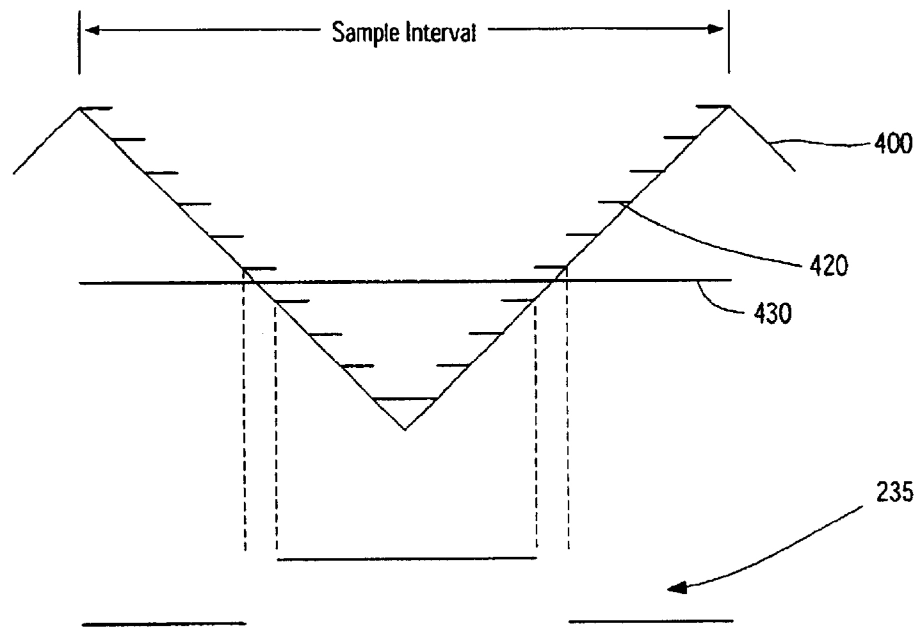
FIGS. 4A and 4B illustrate the levels, waveforms, and signals respectively associated with the first and second stages of an exemplary multistage pulse width modulator according to the present invention.
Figure 4B:
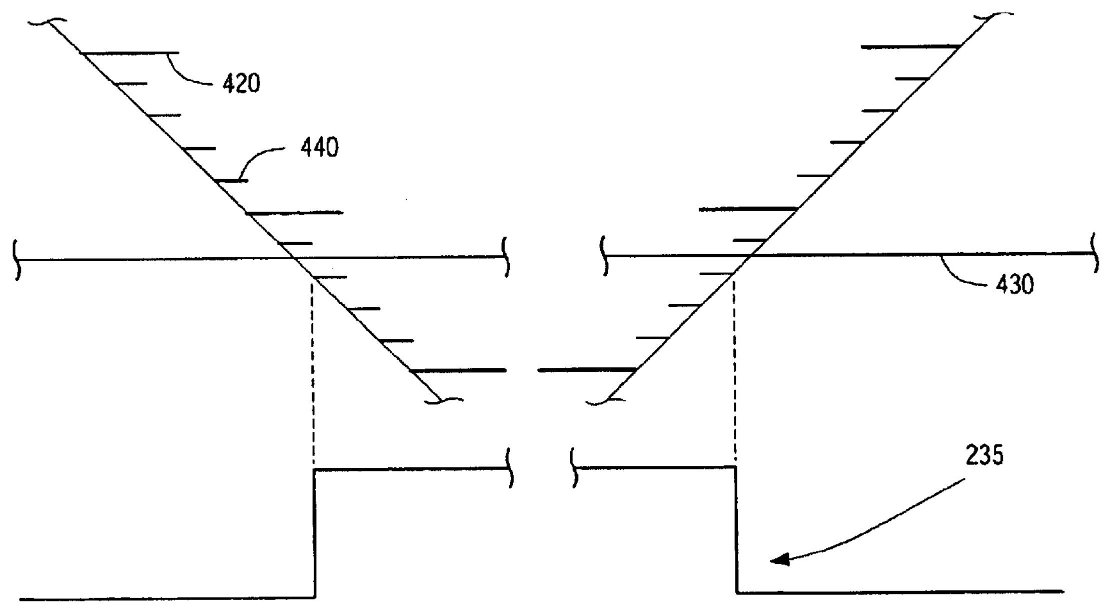

In an ideal implementation, each output pulse is fully symmetric around the center of the sampling interval, and infinite resolution indicates that signal comparisons are exact so that the transitions from low-to-high values or high-to-low values are precisely defined. A typical digital solution inherently has a finite resolution of the output signal as determined by the number of discrete time steps or intervals within the sample interval and also the signal level intervals associated with each time interval. The effect of finite resolution is illustrated in FIGS. 4A and 4B as will be described below.

Figure 2:
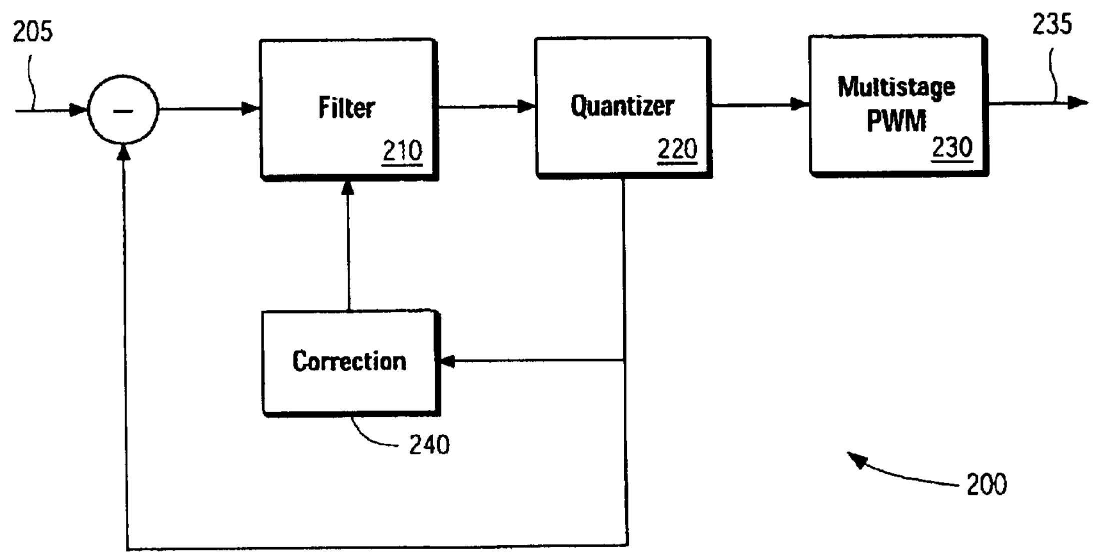
FIG. 2 is a simplified block diagram of a portion of a digital-to-analog conversion circuit including an exemplary multistage pulse width modulator according to the present invention.

FIG. 2 is a simplified block diagram of a portion of digital-to-analog conversion circuit 200 including multistage pulse width modulator 230. In this example, a digital signal 205 is received by filter 210, which performs any desired or necessary signal filtering tasks. Quantizer 220 samples and processes the received digital signal to produce sample signals for use by multistage pulse width modulator 230. Quantizer 220 returns information to correction block 240 for adjusting the state of filter 210. Quantizer 220 also returns information to a gain stage (in this case a subtractive stage) for further signal processing. Multistage pulse width modulator ("PWM") 230 produces pulses according to the samples received from quantizer 220. For example, the pulse width modulated output signal 235 is then utilized to control one or more transistors that drive a speaker, to control a power supply, to adjust a motor, or the like. Digital-to-analog conversion circuit 200 is only one example of the types of circuits that utilize a multistage pulse width modulator, such as multistage pulse width modulator 230.

Figure 3:
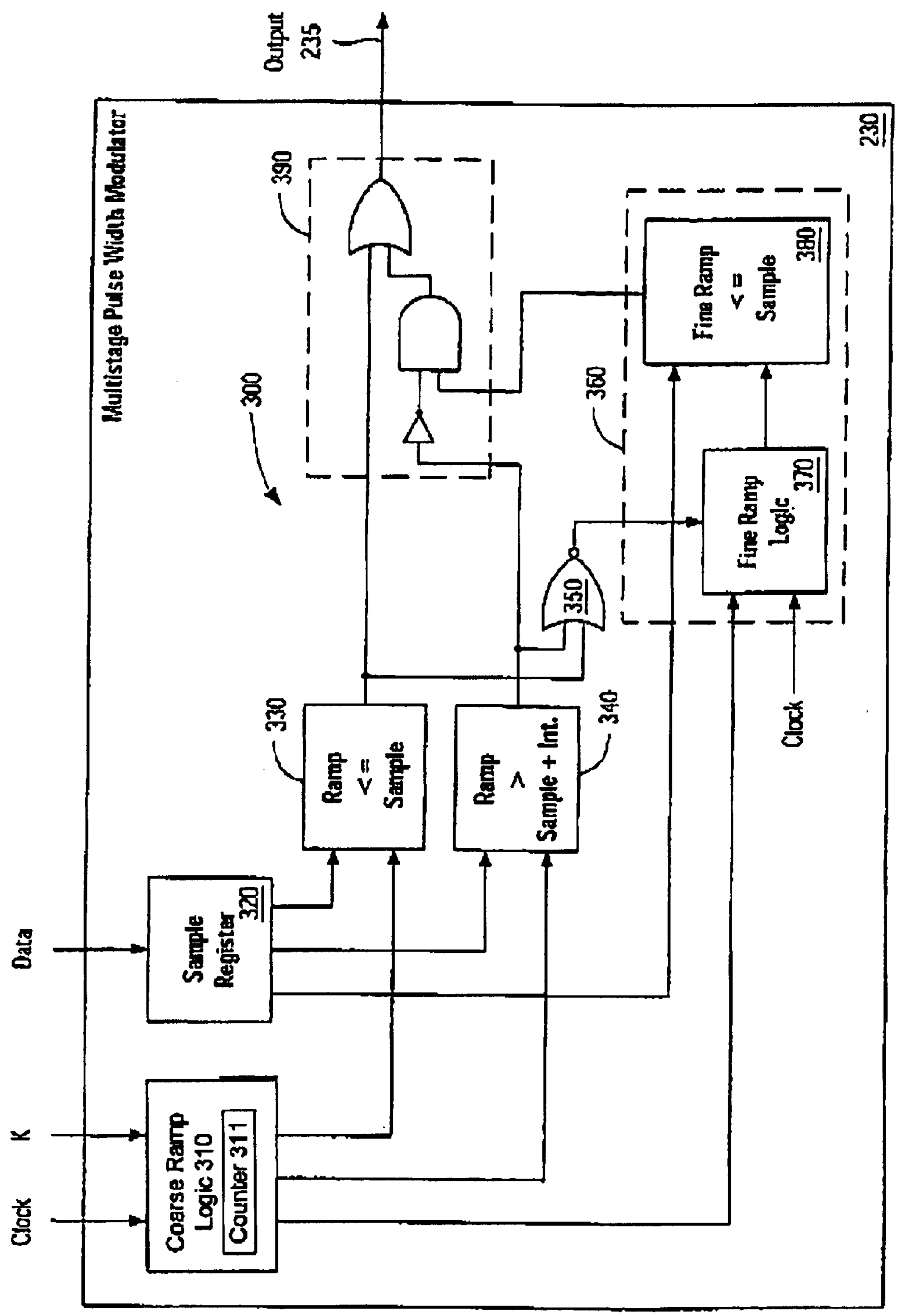
FIG. 3 is a simplified block diagram of an exemplary multistage pulse width modulator according to the present invention.

FIG. 3 is a simplified block diagram of one exemplary embodiment of multistage pulse width modulator 230. Multistage pulse width modulator 230 generally includes two stages 300 and 360 and may include additional stages. Sample register 320 receives data from quantizer 220. Sample register 320 typically includes enough register space to contain at least one sample signal for comparison. In other examples, sample register 320 may be some other memory structure, such as a buffer or FIFO structure. The reference signal for stage 300 of multistage pulse width modulator 230 is determined by coarse ramp logic system 310. Coarse ramp logic system 310 typically produces a series of ramp signals approximating an ideal reference signal, such as triangle waveform 100 of FIG. 1 within the resolution limits of the first stage. By setting the resolution of the first stage lower (e.g., with larger time intervals), stage 300 does not need to utilize a higher clock speed signal that a higher resolution stage would typically need.

Coarse ramp logic system 310 may be implemented in a number of ways. As illustrated, coarse ramp logic system 310 receives a clock signal and a dividing factor K. When a clock rate corresponding to the received clock signal is divided by the factor K, a new (slower) clock rate upon which the reference signal is based for stage 300 is determined. Coarse ramp logic system 310 includes a counter circuit 311 from which the reference signal is constructed. For example, the counter circuit 311 produces an output signal ranging from zero to a maximum number of signal intervals or levels minus one. The number of signal intervals is directly related to the number of time intervals utilized by the stage. For example, if one complete sample interval is divided into 64 time internals, the corresponding reference signal typically has 32 signal intervals or steps "down" (e.g., moving from the highest reference signal value to the lowest reference signal value in the center of the sample interval) and 32 steps "up". Thus, the reference signal is approximated by a number of discrete signals having a set time interval and signal interval. As the counter circuit 311 proceeds from zero to the maximum number of signal intervals minus one, the counter signal is inverted for the second half of the sample interval. If necessary, the final output of the counter circuit 311 is inverted to produce the desired waveform shape (e.g., starting from the highest value, moving to the lowest value in the middle of the sample interval, and returning to the highest value at the end of the sample interval). A variety of other schemes and corresponding circuits for producing the reference signal may also be utilized.

Both the sample signal and the reference signal are supplied to comparator 330, which makes the first of two comparisons utilized by stage 300. Comparator 330 compares the reference signal to the sample signal and determines whether the reference signal is less than or equal to the sample signal. If the result of the comparison is positive (e.g., the reference signal is less than or equal to the sample signal), then comparator 330 produces a corresponding output signal, which is typically a logic true value such as a high signal level. If the result of the comparison is negative, (e.g., the reference signal is not less than or equal to the sample signal), then comparator 330 produces a corresponding output signal, which is typically a logic false value such as a low signal level. The resulting output signal from comparator 330 is sent to output logic 390, which ensures that modulator 230 produces the proper output signal 235.

Comparator 340 also receives the sample signal and the reference signal. Comparator 340 compares the reference signal to a sum of the sample signal and the signal interval as previously determined by the dividing factor K. If the reference signal is greater than the sum of the sample signal and the signal interval, the result of the comparison is positive. If the reference signal is not greater than the sum of the sample signal and the signal interval, then the result of the comparison is negative. The output signal from comparator 340 is sent to output logic 390, which ensures that modulator 230 produces the proper output signal 235.

FIG. 4A illustrates the output signal 235 resulting from the comparison of comparator 340. In this example, nine signal intervals decrease while nine signal intervals increase. Ten corresponding reference signals 420 are in the decreasing direction, and ten reference signals 420 are in the increasing direction. Collectively, the reference signals 420 approximate an ideal reference signal 400. The sample signal is shown by level 430. As shown by the first five reference signals 420 (moving from left to right), the result of the comparison performed by comparator 330 is negative (e.g., the reference signal is not less than or equal to the sample signal). For the same five reference signals 420, the result of the comparison performed by comparator 340 is positive (e.g., the reference signal is greater than the sum of the sample signal and one signal interval). Output 235 remains low, and the result from NOR gate 350 is logically false, (e.g., low value so that stage 360 is not activated). The next reference signal 420 is still greater than sample signal 430, and the result of the comparison performed by comparator 330 is negative. However, the same reference signal is no longer greater than the sum of the sample signal and one signal interval as determined by comparator 340. Because the output signal from both comparators is logically false, NOR gate 350 produces a true output signal thereby activating stage 360.

In one embodiment, stage 360 includes fine ramp logic 370 and comparator 380. In general, fine ramp logic 370 is similar to coarse ramp logic 310 with at least two important differences. Fine ramp logic 370 produces reference signals starting with the value of the reference signal produced by coarse ramp logic 310 when stage 360 is activated. Also, fine ramp logic 370 uses smaller time intervals and signal intervals than those used by coarse ramp logic 310. For example, fine ramp logic 370 produces reference signals based directly on the clock signal that it receives. Thus, fine ramp logic 370 produces a higher resolution reference signal. However, stage 370 is typically activated only when the higher resolution is needed, (e.g., when the sample signal is within one signal interval of a reference signal generated by coarse ramp logic 310).

When stage 360 is activated, comparator 380 compares the reference signal from fine ramp logic 370 with the sample signal from sample register 320. In this example, if the reference signal is less than or equal to the sample signal, the comparison result is positive and a logical true signal (e.g., a high signal) is produced as output signal 235. If the reference signal is not less than or equal to the sample signal, the comparison result is negative, and a logic false signal (e.g., a low signal) is produced as output signal 235.

As noted above, output logic 390 is utilized to ensure that the proper output signal 235 is produced from the various signals provided by comparators 330, 340, and 380. FIG. 3 illustrates one possible implementation (using an inverter, an AND gate, and an OR gate) of output logic 390. An alternative to utilizing output logic 390 is to encode logic on the output to the next stage. For example, when the output of comparator 330 is active, the sample input to comparator 380 is forced high. Similarly, when the output of comparator 340 is active, the sample input to comparator 380 is forced low. However, a variety of different logic structures may be implemented to perform the same task. Additionally, variations in the implementation of other portions of modulator 230 may dictate variation in the implementation of output logic 390. In general, different encodings of logic for control between stages can be used.

FIG. 4B illustrates the output signal 235 resulting from the comparison performed by comparator 380. Fine ramp logic 370 produces reference signals 440. In this example, five signal intervals and thus four additional reference signals 440 exist between reference signals 420, which are produced by coarse ramp logic 310. Additional reference signals 440 (not illustrated) coincide with reference signals 420 as produced by coarse ramp logic 310. As stage 360 cycles through each reference signal 440, the reference signal is compared with the sample signal and the appropriate output value is generated. In one embodiment, operation of stage 360 continues until the signal level corresponding to the next reference signal 420 is reached. At that time, stage 360 is deactivated, and the level of output signal 235 is determined by stage 300. When comparators 330 and 340 both have negative results, stage 360 is activated.

In this example, stage 360 includes only one comparator. The type of comparisons made may vary depending upon the desired form of output signal 235 and the form of the reference signals utilized. The counter utilized in the second stage may also be utilized for the clock divider signal in the first stage.

The examples described above illustrate a two stage, and thus two resolution, multistage pulse width modulator. However, additional stages may be added to further enhance the resolution of multistage pulse width modulator 230. For example, a three stage pulse width modulator might be implemented where the first and second stages are similar to stage 300 but use large and intermediate step sizes, respectively. The third stage would be similar to stage 360 and use a fine step size. Furthermore, one or more additional stages beyond the first two stages are implemented such that the additional stages are optionally activated when additional resolution is desired.

A variety of different circuits may be utilized to implement comparators 330, 340, and 380, including iterative networks of logic gates and adders. Although the examples described have emphasized digital logic implementations, the devices and techniques of the present invention may be implemented utilizing analog circuitry and signals.

Signal flow in the multi-stage pulse width modulator is "forward"—going from input towards output—and typically without any loops. Thus, any number of pipe-lining registers is inserted into the circuit as is deemed necessary to operate at the desired speed given a specific process and operating environment.

While the invention has been described in light of the embodiments discussed above, one skilled in the art will recognize that certain substitutions may be easily made in the circuits without departing from the teachings of this disclosure. For example, a variety of logic gate structures may be substituted for those shown and still preserve the operation of the circuit. In particular, a NAND gate may be replaced by a NOR gate by appropriate polarity changes of the various signals in accordance with DeMorgan's law. Also, many circuits using NMOS transistors may be implemented using PMOS transistors instead as is well known in the art, provided the logic polarity and power supply potentials are reversed. The transistor conductivity-type (i.e., N-channel or P-channel) within a CMOS circuit may be frequently reversed while still preserving similar analogous operation.

Although the present invention has been described with respect to specific preferred embodiments thereof, various changes and modifications may be suggested to one skilled in the art and it is intended that the present invention encompass such changes and modifications fall within the scope of the appended claims.

What is claimed is:

1. An apparatus comprising:

a first pulse width modulator stage including a first comparator operable to receive a first reference signal and a sample signal and to compare the first reference signal to the sample signal; and a second pulse width modulator stage coupled to the first pulse width modulator stage and including a second comparator operable to receive a second reference signal and the sample signal and to compare the second reference signal to the sample signal; and wherein the first pulse width modulator stage operates at lower clock speed than the second pulse width modulator stage.

2. The apparatus of claim 1 wherein the first comparator includes a first output terminal and the first comparator is further operable to produce a first output signal on the first output terminal depending on a comparison of the first reference signal and the sample signal.

3. The apparatus of claim 2 wherein the second comparator includes a second output terminal and the second comparator is further operable to produce a second output signal on the second output terminal depending on a comparison of the second reference signal and the sample signal.

4. The apparatus of claim 3 further comprising:

a pulse width modulation output terminal coupled to the first output terminal and the second output terminal.

5. The apparatus of claim 1 further comprising:

a first reference signal generation circuit operable to generate the first reference signal for a first time interval.

6. The apparatus of claim 5 wherein the first reference signal generation circuit includes a counter.

7. The apparatus of claim 5 further comprising:

a second reference signal generation circuit operable to generate the second reference signal for a second time interval.

8. The apparatus of claim 7 wherein the first time interval is greater than the second time interval and wherein the first pulse width modulator stage operates at a lower clock speed than the second pulse width modulator stage.

9. The apparatus of claim 7 wherein the first reference signal generation circuit includes a first clock signal input terminal and the second reference signal generation circuit includes a second clock signal input terminal, the first time interval extending for a plurality of clock signal cycles from a clock signal applied to the first clock signal input terminal, and the second time interval extending for one clock signal cycle from a dock signal applied to the second clock signal input terminal.

10. The apparatus of claim 9 wherein the clock signal applied to the first clock signal input terminal and the clock signal applied to the second clock signal input terminal are the same signal.

11. The apparatus of claim 1 wherein the first comparator determines at least one of the following: the first reference signal is greater than the sample signal, the first reference signal is equal to the sample signal, and the first reference signal is less than the sample signal.

12. The apparatus of claim 1 wherein the first pulse width modulator stage further comprises a third comparator operable to compare the first reference signal to a sum of the sample signal and a signal level interval.

13. The apparatus of claim 1 wherein the second comparator determines at least one of the following: the second reference signal is greater than the sample signal, the second reference signal is equal to the sample signal, and the second reference signal is less than the sample signal.

14. A method of producing a pulse width modulated signal comprising:

generating a first reference signal for a first time interval;

comparing the first reference signal to a sample signal;

producing a first output signal depending on the comparing the first reference signal to a sample signal;

generating a second reference signal for a second time interval wherein the first time interval is greater than the second time interval;

comparing the second reference signal to the sample signal; and producing a second output signal depending on the comparing the second reference signal to the sample signal.

15. The method of claim 14 further comprising:

comparing the first reference signal to a sum of the sample signal and a signal level interval; and producing a third output signal depending on the comparing the first reference signal to a sum of the sample signal and a signal level interval.

16. The method of claim 15 wherein at least one of the generating a second reference signal, the comparing the second reference signal to the sample signal, and the producing a second output signal depending on the comparing the second reference signal to the sample signal is performed when:

a result of the comparing the first reference signal to a sample signal is negative; and a result of the comparing the first reference signal to a sum of the sample signal and a signal level interval is negative.

17. The method of claim 14 wherein:

the comparing the first reference signal to a sample signal further comprises determining at least one of: the first reference signal is greater than the sample signal, the first reference signal is equal to the sample signal, and the first reference signal is less than the sample signal; and the comparing the second reference signal to the sample signal further comprises determining at least one of: the second reference signal is greater than the sample signal, the second reference signal is equal to the sample signal, and the second reference signal is less than the sample signal.

18. A method of producing a pulse width modulated signal comprising:

generating a first reference signal;

comparing the firs reference signal to a sample signal;

producing a first output signal depending on the comparing the first reference signal to a sample signal;

generating a second reference signal;

comparing the second reference signal to the sample signal;

producing a second output signal depending on the comparing the second reference signal to the sample signal;

comparing the first reference signal to a sum of the sample signal and a signal level interval; and producing a third output signal depending on the comparing the first reference signal to a sum of the sample signal and a signal level interval.

19. The method of claim 18 wherein at least one of the generating a second reference signal, the comparing the second reference signal to the sample signal, and the producing a second output signal depending on the comparing the second reference signal to the sample signal is performed when:

a result of the comparing the first reference signal to a sample signal is negative; and a result of the comparing the first reference signal to a sum of the sample signal and a signal level interval is negative.

* * * * *